(12) United States Patent
Melnik et al.

(10) Patent No.: US 8,853,086 B2
(45) Date of Patent: Oct. 7, 2014

(54) METHODS FOR PRETREATMENT OF GROUP III-NITRIDE DEPOSITIONS

(75) Inventors: Yuriy Melnik, San Jose, CA (US); Lu Chen, Cupertino, CA (US); Hidehiro Kojiri, Sunnyvale, CA (US)

(73) Assignee: Applied Materials, Inc., Santa Clara, CA (US)

( * ) Notice: Subject to any disclaimer, the term of this patent is extended or adjusted under 35 U.S.C. 154(b) by 0 days.

(21) Appl. No.: 13/469,048

(22) Filed: May 10, 2012

(65) Prior Publication Data

US 2012/0295428 A1 Nov. 22, 2012

Related U.S. Application Data

(60) Provisional application No. 61/488,673, filed on May 20, 2011.

(51) Int. Cl.
| | |
|---|---|
| *H01L 21/311* | (2006.01) |
| *H01L 21/02* | (2006.01) |
| *H01L 33/00* | (2010.01) |

(52) U.S. Cl.
CPC ........... *H01L 21/0254* (2013.01); *H01L 33/007* (2013.01); *H01L 21/02458* (2013.01); *H01L 21/0242* (2013.01); *H01L 21/0262* (2013.01); *H01L 21/02658* (2013.01)
USPC .................................. 438/695; 257/E21.226

(58) Field of Classification Search
CPC .................. H01L 21/28575; H01L 21/31116; H01L 21/3065; H01L 29/456
USPC ........... 257/189, 615, 745, E21.09, E21.226; 438/222–226, 413, 416, 477, 603–604, 438/565, 680–681, 695, 706, 711, 775, 504
See application file for complete search history.

(56) References Cited

U.S. PATENT DOCUMENTS

| | | | |
|---|---|---|---|
| 5,376,580 | A | 12/1994 | Kish et al. |
| 5,686,738 | A | 11/1997 | Moustakas |

(Continued)

FOREIGN PATENT DOCUMENTS

| | | |
|---|---|---|
| EP | 0541373 A2 | 5/1993 |
| JP | 2004-111865 | 4/2004 |

(Continued)

OTHER PUBLICATIONS

International Search Report and the Written opinion of the International Searching Auythority for PCT/US12/038729, mailed Nov. 28, 2012, 10 pages.

(Continued)

*Primary Examiner* — Quoc Hoang
(74) *Attorney, Agent, or Firm* — Blakely, Sokoloff, Taylor & Zafman LLP

(57) ABSTRACT

Embodiments of the present disclosure relate to methods for pretreatment of substrates and group III-nitride layers for manufacturing devices such as light emitting diodes (LEDs), laser diodes (LDs) or power electronic devices. One embodiment of the present disclosure provides a method including providing one or more substrates having an aluminum containing surface in a processing chamber and exposing a surface of each of the one or more substrates having an aluminum containing surface to a pretreatment gas mixture to form a pretreated surface. The pretreatment gas mixture includes ammonia ($NH_3$), an aluminum halide gas (e.g., $AlCl_3$, AlCl) and an etchant containing gas that includes a halogen gas (e.g., $Cl_2$) or hydrogen halide gas (e.g., HCl).

19 Claims, 10 Drawing Sheets

(56) References Cited

U.S. PATENT DOCUMENTS

| | | | |
|---|---|---|---|
| 5,827,570 A * | 10/1998 | Russell | 427/255.34 |
| 6,410,172 B1 * | 6/2002 | Gilbert, Sr. | 428/698 |
| 6,528,394 B1 * | 3/2003 | Lee | 438/478 |
| 6,551,848 B2 | 4/2003 | Kwak et al. | |
| 6,676,751 B2 | 1/2004 | Solomon et al. | |
| 6,692,568 B2 | 2/2004 | Cuomo et al. | |
| 7,368,368 B2 | 5/2008 | Emerson | |
| 7,585,769 B2 * | 9/2009 | Bour et al. | 438/681 |
| 7,611,915 B2 | 11/2009 | Slater, Jr. et al. | |
| 7,838,315 B2 | 11/2010 | Yang et al. | |
| 7,875,535 B2 * | 1/2011 | Kikkawa et al. | 438/493 |
| 7,897,490 B2 * | 3/2011 | Preble et al. | 438/478 |
| 7,935,382 B2 * | 5/2011 | Park et al. | 427/126.1 |
| 7,943,485 B2 | 5/2011 | Francis et al. | |
| 8,080,466 B2 * | 12/2011 | Su et al. | 438/478 |
| 2004/0115917 A1 | 6/2004 | Shibata et al. | |
| 2006/0008941 A1 | 1/2006 | Haskell et al. | |
| 2006/0051554 A1 | 3/2006 | Kumakura et al. | |
| 2006/0246614 A1 | 11/2006 | Suh | |
| 2007/0259502 A1 | 11/2007 | Bour et al. | |
| 2008/0083970 A1 | 4/2008 | Kamber et al. | |
| 2009/0149008 A1 | 6/2009 | Kryliouk et al. | |
| 2009/0173951 A1 | 7/2009 | Kikkawa et al. | |
| 2009/0269867 A1 | 10/2009 | Shakuda | |
| 2010/0012948 A1 | 1/2010 | Usikov et al. | |
| 2010/0124261 A1 | 5/2010 | Hart | |
| 2010/0273318 A1 | 10/2010 | Melnik et al. | |
| 2010/0279020 A1 | 11/2010 | Melnik et al. | |
| 2011/0042682 A1 | 2/2011 | Preble et al. | |

FOREIGN PATENT DOCUMENTS

| | | |
|---|---|---|
| JP | 2005-347494 | 12/2005 |
| WO | WO-2011/056456 | 5/2011 |

OTHER PUBLICATIONS

International Search Report and the Written opinion of the International Searching Auythority for PCT/US2012/038730, mailed Jan. 28, 2013, 8 pages.

International Search Report and the Written opinion of the International Searching Auythority for PCT/US2012/038727, mailed Jan. 10, 2013, 9 pages.

Avrutin, Vitally, et al., "Growth of Bulk GaN and AlN: Progress and Challenges", *IEEE*, vol. 98, No. 7, (14pp), (Jul. 2010).

International Preliminary Report on Patentability for PCT/US12/038730, mailed Nov. 28, 2013, 5 pages.

International Preliminary Report on Patentability for PCT/US12/038727, mailed Nov. 28, 2013, 6 pages.

International Preliminary Report on Patentability for PCT/US12/038729, mailed Nov. 28, 2013, 6 pages.

Allerman, A. A., et al., "Growth and design of deep-UV (240-290 nm)light emmitting diodes using AlGaN alloys", *Journal of Crystal Growth* 272 (2004) 15 pages.

Baranov, B., et al., "Epitaxial Growth and Electrical Properties of GaN-AlN Solid Solutions", *Kristall und Technik*, Dec. 27, 1976, 3 pages.

Baranov, B., et al., "Growth and Properties of AlxGa1-xN Epitaxial Layers", *Phys. Stat. Sol.* (a) 49, Jul. 31, 1978, 8 pages.

Bliss, D. F., et al., "Aluminum Nitride Substrate Growth by Halide Vapor Transport Epitaxy", *Journal of Crystal Growth* 250, (2003), 6 pages.

Bugge, F., et al., "Growth Kinetics, Structure and Surface Morphology of AlN/α-Al2O3 Epitaxial Layers", *Crystal Research and Technology*, vol. 22, No. 1 (1987) pp. 65-73.

Cai, D., et al., "Modeling of Gas Phase and Surface Reactions in an Aluminum Nitride Growth System", *Journal of Crystal Growth* 293, Mar. 26, 2006, 10 pages.

Chu, T. L., et al., "Epitaxial Growth of Aluminum Nitride", *Solid-State Electronics*, Pergamon Press 1967, vol. 10. pp. 1023-1027 Great Britain.

Chu, T. L., et al., "The Preparation and Properties of Aluminum Nitride Films", *J. Electrochem. Soc.: Solid-State Science and Technology*, Jul. 1975, 6 pages.

Claudel, A., et al., "Thermodynamic and experimental investigations on the growth of thick aluminum nitride layers by high temperature CVD", *Journal of Crystal Growth* Mar. 26, 2009, 10 pages.

Dollet, A., et al., "Chemical vapor deposition of polycrystalline AlN films from AlCl3-NH3 mixtures. Analysis and modeling of transport phenomena", *Thin Solid Films* 406, Aug. 17, 2000, 16 pages.

Dwikusuma, Fransiska, "Sapphire Surface preparation and GaN Nucleation by Hydride Vapor Phase Epitaxy", *Dissertation, University fo Wisconsin-Madison*, 2003, 252 pages.

Egashira, Yasuyuki et al., "Cluster Size Determination in the chemical Vapor Deposition of Aluminum Nitride", *J. Am. Ceram. Soc.*, 77 (8) Mar. 29, 1993, 8 pages.

Eriguchi, Ken-Ichi, et al., "MOVPE-like HVPE of AlN using Solid Aluminum Trichloride Source", *Journal of Crystal Growth* 298, Nov. 22, 2006, 4 pages.

Kumagai, Yoshinao, et al., "Growth of Thick AlN Layers by Hydride Vapor-phase Epitaxy", *Journal of Crystal Growth* www.sciencedirect.com, Apr. 15, 2005, 6 pages Lebedev, A. O., et al., "Activation Energy of Aluminum Nitride Deposition from a Chloride-Hydride System", *Russian Journal of Applied Chemistry*, vol. 67, No. 1, Part 2, 1994, 4 pages.

Lebedev, A. O., et al., "Epitaxial growth of aluminum nitride on sapphire using modified chloride-hydride method", *Inst. Phys. Conf. Ser. No. 137*: Chapter 4, 1993, 3 pages.

Maruska, H. P., et al., "The Preparation and Properties of Vapor-Depisited Single-Crystal-Line GaN", *Applied Physics Letters*, vol. 15, No. 10, Nov. 15, 1969, 3 pages.

Melnik, Yuriy, et al., "AlN Substrates: Fabrication via Vapor Phase Growth and Characterization", *Phys. Stat. Sol.* (a) 200, No. 1, (2003) pp. 22-25.

Melnik, Yu. V., et al., "AlN/GaN and AlGaN/GaN Heterostructures Grown by HVPE on SiC Substraites", *Mat. Res. Soc. Symp. Proc.* vol. 482, (1998) 6 pages.

Melnik, Yu. V., et al., "First AlGaN free-standing wafers", *Mat. Res. Soc. Symp. Proc.* vol. 764, 2003, 6 pages.

Park, Jong-Rok, et al., "Gas-phase synthesis of AlN powders from AlCl3-NH3-N2", *Journal of Materials Science* 28 (1993) 8 pages.

Pauleau, Y., et al., "Thermodynamics and Kinetics of Chemical Vapor Deposition of Aluminum Nitride Films", *Journal of the Electrochemical Society, Solid-State Science and Technology*, Jul. 1980, 6 pages.

Pichugin, I. G. et al., *Tlectrotekh. Inst.*, No. 302 (1982) [in Russian]— pp. 3-6.

Renner, T., "Herstellung der Nitride von Bor, Amuminum, Gallium und Indium nach dem Aufwachsverfahren", *Anorg. Allg. Chem.* 298 (1959) [in German] pp. 22-33.

Segal, A. S., et al., "Modeling Analysis of AlN and AlGaN HVPE", *Physica Status Solidi* (c) 6 (2009) S329-S332, 4 pages.

Timoshkin, Alexey Y., et al., "The Chemical Vapor Deposition of Aluminum Nitride; Unusual Cluster Formation in the Gas Phase", *J. Am. Chem. Soc.* 1997, 119, Dec. 3, 1996, 12 pages.

Tsaregorodtsev, A. M., et al., "AlGaN Films Grown by Chloride-hydride Chemical Vapor Deposition (CH CVD)", *Institute of Physics Conference Series No. 155*: Chapter 3 (1997) pp. 243-246.

Wang, Moo-Chin, et al., "Effect of process parameters on synthesis of aluminum nitride powder prepared by chemical vapor deposition", *Journal of Materials Science* 36 (2001) 7 pages.

Yim, W. M., et al., "Epitaxially grown AlN and its optical band gap", *J. Appl. Phys.*, vol. 44, No. 1, Jan. 1973, 5 pages.

Yoshioka, Masayuki, et al., "Growth of the AlN nano-pillar crystal films by means of a halide chemical vapor deposition under atmospheric pressure", *Materials Chemistry and Physics* 86, Jan. 19, 2004, 4 pages.

\* cited by examiner

METHODS FOR PRETREATMENT OF GROUP III-NITRIDE DEPOSITIONS

RELATED APPLICATIONS

This application claims the benefit of Provisional Application No. 61/488,673, filed May 20, 2011, which is incorporated herein by reference.

FIELD

Embodiments of the present disclosure relate to the manufacture of semiconductor devices. More particularly, embodiments of the present disclosure relate to methods for pretreatment of substrates for manufacturing group III nitride semiconductor devices.

DESCRIPTION OF THE RELATED ART

Group III-nitride semiconductors are finding greater importance in the development and fabrication of a variety of semiconductor devices, such as short wavelength light emitting diodes (LEDs), laser diodes (LDs), and electronic devices including high power, high frequency, high temperature transistors and integrated circuits. Light emitting diodes (LEDs) and laser diodes (LDs) are fabricated by depositing group III-nitrides on most commonly used sapphire substrates. Group III-nitrides can be deposited by metal organic chemical vapor deposition (MOCVD), hydride vapor phase epitaxy (HVPE), molecular beam epitaxy (MBE), and/or physical vapor deposition (PVD) on aluminum oxide containing substrates, such as sapphire substrates.

The significant lattice mismatch between the sapphire substrate and group III-nitrides has motivated the development of common three growth steps to obtain high quality GaN layers on sapphire: a high temperature nitridation of the sapphire surface in NH3 contained atmosphere, a deposition of a low-temperature buffer layer (or initial layer, or nucleation layer) and a high temperature low defect density epitaxial layer growth. Various models of the growth using low temperature GaN or AlN, or high temperature AlN buffer layers were developed. The buffer (or initial, or nucleation) layers promote a two-dimensional (2D) growth of group III-nitrides. On the other hand, the deposition of group III-nitrides directly on sapphire surface at high temperatures results in three-dimensional (3D) growth. It is expected that such a 3D growth leads to rough group III-nitrides surfaces and poor crystal quality.

Another way to obtain high quality group III-nitrides is using pretreatment of substrates having an aluminum containing surface (e.g., sapphire). Substrates having an aluminum containing surface may be pretreated before deposition of group III-nitrides to generate low defect density group III-nitride layers without additional buffer layer deposition. The traditional methods for treating substrates having an aluminum containing surface (mostly sapphire) include exposing a surface of the substrates to a pretreatment gas mixture that includes ammonia (NH3) and Cl2 or HCl. The Cl2 or HCl etches the surface of aluminum containing substrates and produces aluminum chloride vapor that can react with ammonia simultaneously delivered during the treating process. As a result of this chemical reaction, the regrowth (deposition) of three-dimensional aluminum nitride (AlN) and/or aluminum oxynitride (AlON) islands on the top of the aluminum containing substrates occurs. The appearance of these three-dimensional AlN and/or AlON islands could enhance the lateral growth for subsequent group III-nitride deposition, which results in the decrease of threading dislocation density.

However, traditional methods for treating aluminum oxide containing substrates cannot separate substrate etching and AlN or AlON deposition for better optimization (e.g., sapphire). For example, increasing the Cl2 or HCl delivery accelerates both substrate etching and AlN or AlON deposition.

SUMMARY

Embodiments of the present disclosure relate to methods for pretreatment of substrates or/and group III-nitride layers for manufacturing devices such as light emitting diodes (LEDs), laser diodes (LDs) or power electronic devices. In one embodiment of the present disclosure, a method includes providing one or more substrates having an aluminum containing surface in a processing chamber and exposing a surface of each of the one or more substrates having an aluminum containing surface to a pretreatment gas mixture to form a pretreated surface. In another embodiment, a method of forming a compound nitride structure includes exposing an aluminum containing surface of group III-nitride layers on one or more substrates to a pretreatment gas mixture to form a pretreated surface. In another embodiment, a method of forming a compound nitride structure includes exposing a first pretreated surface of one or more substrates having an aluminum containing surface to a second pretreatment gas mixture to form a second pretreated surface. The pretreatment gas mixtures may include ammonia gas ($NH_3$), an aluminum halide gas (e.g., $AlCl_3$, AlCl), and an etchant containing gas that includes a halogen gas (e.g., Cl2) or hydrogen halide gas (e.g., HCl). The pretreatment procedure could enhance the lateral growth for subsequent group III-nitride deposition, which results in the decrease of threading dislocation density in the subsequently deposited layers. The pretreatment procedure can also reduce or tune the stress in the subsequently deposited layers and final device structures.

BRIEF DESCRIPTION OF THE DRAWINGS

So that the manner in which the above recited features of the present disclosure can be understood in detail, a more particular description of the invention, briefly summarized above, may be had by reference to embodiments, some of which are illustrated in the appended drawings. It is to be noted, however, that the appended drawings illustrate only typical embodiments of this invention and are therefore not to be considered limiting of its scope, for the invention may admit to other equally effective embodiments.

To facilitate understanding, identical reference numerals have been used, where possible, to designate identical elements that are common to the figures. It is contemplated that elements disclosed in one embodiment may be beneficially utilized on other embodiments without specific recitation.

DETAILED DESCRIPTION

Figure 1A:
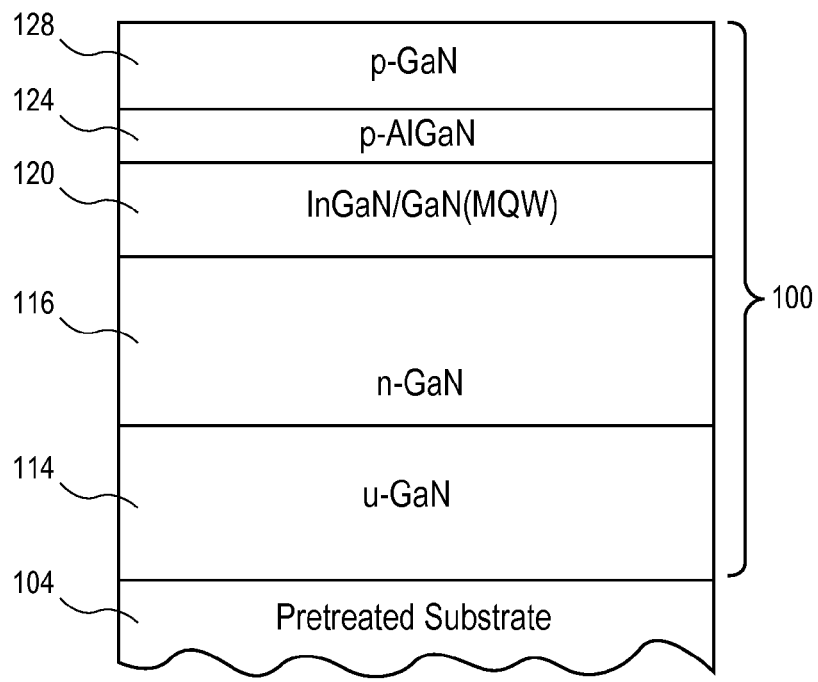
FIG. 1A is a schematic sectional side view of a GaN based LED structure according to one embodiment of the present disclosure.

The present disclosure generally provides methods for manufacturing group III-nitride semiconductor devices. In one embodiment of the present disclosure, a method includes treating a substrate having an aluminum containing surface by exposing the aluminum containing surface to a pretreatment gas mixture that includes ammonia, an etchant containing gas, and an aluminum halide gas. The etchant containing gas includes a halogen gas or hydrogen halide gas. In some embodiments, the etchant containing gas may be selected from the group consisting of chlorine gas (Cl2), bromine gas (Br2), iodine gas (I2), hydrogen chloride gas (HCl), hydrogen bromide gas (HBr), hydrogen iodide gas (HI), combinations thereof, and mixtures thereof. The pretreatment gas mixture reacts with the aluminum containing surface and forms a layer, or a formed region, of aluminum nitride (AlN) and/or aluminum oxynitride (AlON) in case of oxygen containing surface on the substrate (e.g., sapphire). The layer of AlON or AlN can work as a buffer layer (e.g., initial layer, nucleation layer) for subsequent group III-nitride depositions. This layer is believed to promote wetting and lateral two-dimensional growth of group III-nitrides, and also reduces, or tunes, the layer stress in the subsequently deposited layers and final device structures. The pretreatment procedure could enhance the lateral growth for subsequent group III-nitride deposition, which results in the decrease of threading dislocation density in the subsequently deposited layers.

Pretreatment to aluminum containing surface using ammonia, aluminum halide gas, and halogen gas or hydrogen halide gas can be used beneficially prior to any deposition technique, such as HVPE, MOCVD, MBE, and PVD.

Embodiments of the present disclosure have advantages over traditional pretreatment and common nitridation of substrates having an aluminum containing surface (e.g., sapphire substrates) because of the use of additional aluminum halide gas (e.g., AlCl3, AlCl, etc.). The traditional methods for pretreating substrates having an aluminum containing surface (mostly sapphire) include exposing a surface of the substrates to a pretreatment gas mixture that includes ammonia (NH3) and Cl2 or HCl. The Cl2 or HCl etches the surface of substrates having an aluminum containing surface and produces aluminum chloride vapor that can react with simultaneously delivered ammonia to produce aluminum nitride (AlN) and/or aluminum oxynitride (AlON) on the surface of the substrates.

The etching effect (e.g., roughness of final regrown AlN or AlON layer) and deposition effect (e.g., deposition rate of AlN or AlON regrowth) mostly depends on amount of etchant gas. The increase in the etchant gas delivery accelerates both substrate etching and AlN or AlON deposition. The optimal (for subsequent group III-nitride deposition) treatment process needs both optimal substrate etching and optimal AlN or AlON deposition. It is not possible to separate these processes in a traditional pretreatment scheme. The additional amount of aluminum halide gas allows independent control of these processes. The additional amount of metal halide gas (e.g., AlCl3, AlCl, etc.) accelerates only the deposition rate of AlN or AlON. As a result, the pretreatment time may be reduced significantly and the etching effect may be minimized to achieve optimal substrate surface parameters. Thus, the improved pretreatment process becomes more stable and reproducible. Minimization of the pretreatment time produces a drastic decrease in the formation of harmful by-products. For example, ammonia chloride (NH4Cl) forms as a by-product in traditional pretreatment of sapphire substrates using HCl (or Cl2) and ammonia before depositing group III-nitride layers on the sapphire substrates. Ammonia chloride may sublime to a solid powder and stick to walls of the reaction chamber, exhaust line, and vacuum pump. The ammonia chloride powder may also be transmitted through the entire processing system, for example with the substrates, carriers, or robots. By drastic decrease in the formation of harmful byproduct, embodiments of the present disclosure improves throughput and increases quality in applicable manufacturing processes, such as manufacturing of LEDs and LDs.

The nitridation of aluminum containing surface before pretreatment can strongly affect the pretreatment process results. The nitridation effect may be explained on the basis of sapphire nitridation model. When sapphire surface is nitrided under flowing NH3 at various temperatures between 600 and 1080 degrees C., the surface compositions of the Al, O and N are changed. Nitrogen was detected for sapphire nitrided at even 600 degrees C., and the nitrogen composition increased with higher temperature, while the oxygen decreased. So, $AlO_xN_{1-x}$ was induced by nitridation, depending on the temperature used. Duration of the nitridation step also affects the surface compositions. However, etching rate of $AlO_xN_{1-x}$ during pretreatment process depends on the surface composition. So, different nitridation schemes of sapphire can strongly affect the pretreatment process results.

In one embodiment, a nitridation process is performed in combination with exposing the substrate having an aluminum containing surface to the pretreatment gas mixture. The nitridation processes may be performed by exposing the substrates surface with a nitridation gas mixture including ammonia and carrier gas. The nitridation process may be performed prior to or after the pretreatment process or both prior to and after the pretreatment process.

In one embodiment, a group III-nitride layer is formed after pretreatment. The group III-nitride layer may be an undoped gallium nitride (uGaN) layer or n-type doped gallium nitride (nGaN) layer. In one embodiment, the pretreatment process further includes a buffer layer (or initial layer, or nucleation layer) forming process. The buffer layer may be an aluminum nitride (AlN) layer, or gallium nitride (GaN) layer, or aluminum gallium nitride (AlGaN) layer. In another embodiment, a group III-nitride buffer layer is formed after the pretreatment by flowing ammonia gas, and a group III-metal halide precursor, such as aluminum chloride or/and gallium chloride.

FIG. 1A is a schematic sectional side view of common gallium nitride based LED structure 100 fabricated over the pretreated substrate 104 in accordance with one embodiment. The substrate 104 having an aluminum containing surface may be formed from solid aluminum oxide, such as single crystal sapphire substrate. The substrate 104 may also be a composite substrate having a surface containing aluminum, such as AlN template comprises an AlN layer and sapphire substrate. Any well-known method, such as masking and etching may be utilized to form features from a planar substrate to create a patterned substrate. In a specific embodiment, the patterned substrate is a patterned sapphire substrate (PSS). Patterned sapphire substrates may work well for the manufacturing of LEDs because they increase the light extraction efficiency which is useful in the fabrication of a new generation of solid state lighting devices. Any well-known masks (e.g., Si3N4 mask, SiO2 mask) may partially cover the substrate having an aluminum containing surface for subsequent group III-nitride lateral overgrowth.

In one embodiment of the present disclosure, the pretreatment gas mixture includes a hydrogen halide gas (e.g., HCl), an aluminum halide gas (e.g., AlCl3, AlCl), and ammonia.

An u-GaN (undoped GaN) layer 114 is subsequently deposited on a pretreated surface of the substrate 104. A n-GaN (n-doped GaN) layer 116 is subsequently deposited on the u-GaN layer 114. The layers 114 and 116 may be formed by a HVPE process or a MOCVD process. In one embodiment, layers 114 and 116 may be deposited at a higher temperature, for example at about 1050 degrees C. The combination of layers 114 and 116 is relatively thick, with deposition of a thickness on the order of 3-7 µm. In one embodiment, the combination of 114 and 116 may reach 10-15 µm.

An InGaN multi-quantum-well (MQW) layer 120 is subsequently deposited over the n-GaN layer 116. The InGaN MQW layer 120 may have a thickness of about 750 Å and form at about 700-800 degrees C.

A p-AlGaN (p-doped AlGaN) layer 124 may be deposited over the multi-quantum-well layer 120. The p-AlGaN layer 124 may have a thickness of about 200 Å and form at a temperature of about 900-1000 degrees C. to form.

A p-GaN (p-doped GaN) contact layer 128 may then be deposited over the p-AlGaN layer 124. The p-GaN contact layer 128 may have a thickness of about 0.4 µm and form at about 1000-1100 degrees C.

Figure 1B:
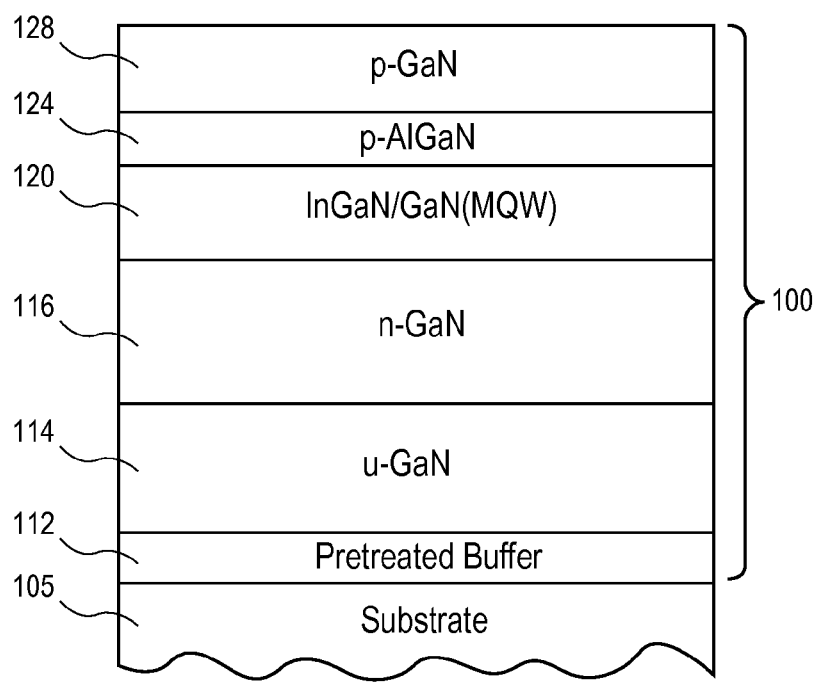
FIG. 1B is a schematic sectional side view of a GaN based LED structure according to one embodiment of the present disclosure.

In another embodiment, as shown in FIG. 1B, the LED structure 100 formed on the substrate 105 includes an aluminum contained buffer layer 112 pretreated before subsequent deposition of u-GaN layer 114. The buffer layer 112 may be formed by a HVPE process or a MOCVD process. In one embodiment of the present disclosure, the buffer layer 112 is pretreated aluminum nitride (AlN) buffer layer. A typical low temperature aluminum nitride (AlN) buffer layer 112 has a thickness of about 50-150 nm, which may be deposited at a temperature of about 450-650 degrees C. Any well-known substrate (e.g., sapphire, silicon carbide, silicon, aluminum nitride) for subsequent group III-Nitride deposition may be utilized in this embodiment.

Figure 1C:
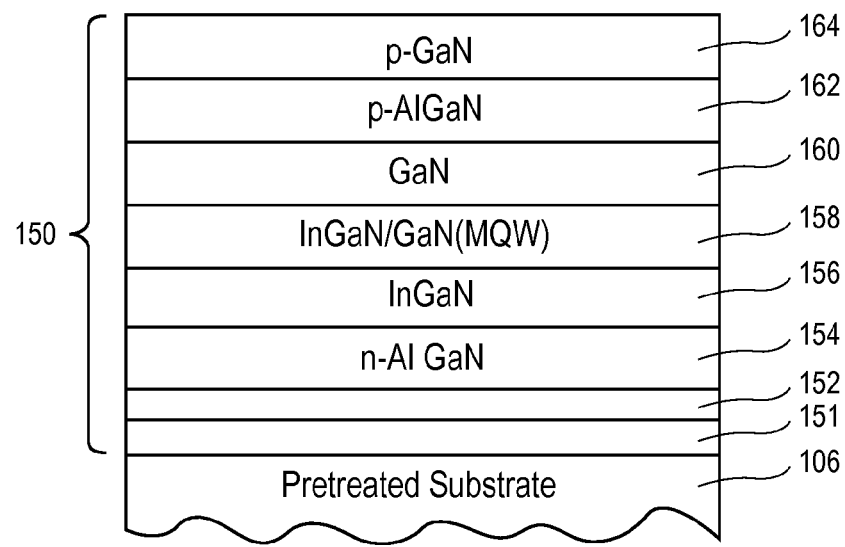
FIG. 1C is a schematic sectional side view of a GaN based LD structure according to one embodiment of the present disclosure.

FIG. 1C is a schematic sectional side view of a GaN based LD structure 150 formed on an aluminum containing substrate 106 in accordance with one embodiment. The aluminum containing substrate 106 may be similar to the aluminum containing substrate 104 of FIG. 1A. The substrate 106 may be formed from solid aluminum oxide, such as sapphire. The substrate 106 may also be a composite substrate having a surface containing aluminum oxide for fabricating a compound nitride structure thereon or any aluminum containing substrate.

In one embodiment, the LD (or LED) structure 150 is formed on the substrate 106 after a nitridation process and a pretreatment process. The nitridation procedure may be performed by exposing the substrate 106 to a nitriding gas mixture including ammonia and carrier gas after the substrate 106 reaches a constant temperature. The pretreatment process may be performed by exposing the substrate 106 to a pretreatment gas mixture after the substrate 106 reaches a constant temperature. In one embodiment, the pretreatment process includes exposing the substrate, initial layer, buffer layer, or other layer to a pretreatment gas mixture when the substrate is heated to an elevated temperature.

The LD structure 150 is a stack of group-III nitride layers formed on the substrate 106. The LD structure 150 starts from an undoped GaN layer 151 and n-type GaN contact layer 152. The LD structure 150 further includes an n-type cladding layer 154. The cladding layer 154 may include AlGaN. An undoped guide layer 156 is formed over the cladding layer 154. The guide layer 156 may include InGaN. An active layer 158 having a multiquantum well (MQW) structure is formed on the guide layer 156. An undoped guide layer 160 is formed over the active layer 158. A p-type electron block layer 162 is formed over the undoped guide layer 160. A p-type contact GaN layer 164 is formed over the p-type electron block layer 162.

Figure 2:
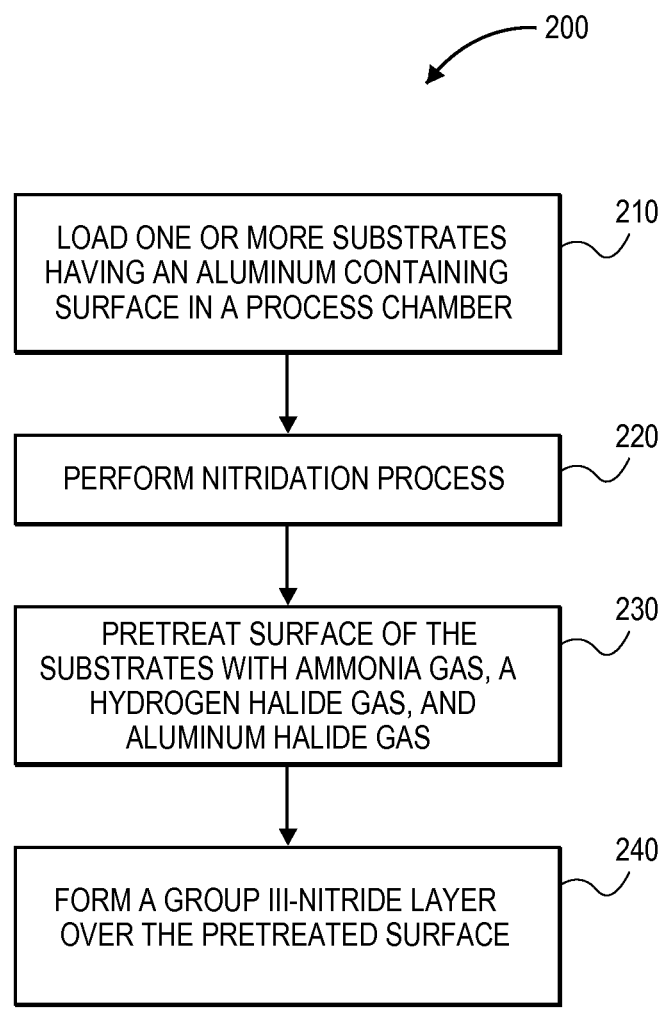
FIG. 2 is a flow diagram of a method for pretreating a substrate according to one embodiment of the present disclosure.

FIG. 2 is a flow diagram of a method 200 for treating a substrate according to one embodiment of the present disclosure. At block 210, one or more substrates having an aluminum containing surface are loaded in a processing chamber. In one embodiment, the substrates having an aluminum containing surface may be sapphire substrates. In one embodiment, the substrates may be positioned in a substrate carrier and transferred into the processing chamber. The substrate carrier is generally adapted to support the substrates during processing. The substrate carrier 616 (FIG. 8) may include one or more recesses within which one or more substrates may be disposed during processing. The substrate carrier may carry six or more substrates. In one embodiment, the substrate carrier carries eight substrates. It is to be understood that more or fewer substrates may be carried on the substrate carrier. Substrate size may range from 50 mm-100 mm in diameter or larger, while substrate carrier size may range from 200 mm to 500 mm in diameter. The substrate carrier 616 may be formed from a variety of materials, including SiC or SiC-coated graphite.

At block 220, the one or more substrates having an aluminum containing surface may be heated in the process chamber while a carrier gas is delivered into the processing region (deposition zone) of a process chamber. The carrier gas may include nitrogen gas (N2), an inert gas such as argon (Ar) or helium (He), or combinations thereof. In one embodiment, a nitridation process may be performed to the one or more substrates having an aluminum containing surface upon the substrates reaching a nitridation temperature. In one embodiment, the nitridation process may be performed by flowing a nitridation gas mixture into the processing chamber. In one embodiment, the nitridation gas mixture includes ammonia and carrier gas. In one embodiment, the carrier gas includes nitrogen gas (N2). The nitridation temperature may be between about 900 degrees C. and about 1100 degrees C. The ammonia flow rate may be between about 1 SLM and 22 SLM. In one example, the nitridation process may be performed by flowing the nitridation gas mixture for about 10 minutes while maintaining the substrate(s) at a temperature of about 1050 degrees C. The nitridation procedure may take additional time, such as on the order of 10 minutes, so that the temperature can be ramped-up and ramped-down. In one embodiment, the temperature ramp-up rate is about 1 degree C./second to about 5 degrees C./second, or other ramp rate depending on the hardware of the process chamber. In another embodiment, the nitridation gas may be delivered into the process chamber during the temperature ramp-up and ramp-down times.

At block 230, the one or more substrates are exposed to a pretreatment gas mixture when the surface is at the pretreatment temperature for a pretreatment to enable high quality group III-nitride layer to be formed (at block 240) over the pretreated substrates. In one embodiment, the pretreatment process may be performed at a temperature range between about 500 degrees C. to about 1200 degrees C. In one embodiment, the pretreatment process may be performed at a temperature between about 900 and about 1000 degrees C. In one example, the pretreatment process temperature may be greater than about 1150 degrees C.

In one embodiment, the pretreatment gas mixture includes ammonia gas, an aluminum halide gas, and an etchant containing gas such as a hydrogen halide (e.g., hydrogen chloride (HCl)) gas. The gas mixture may etch (or react with) the surface of the substrate and form a layer (or a regions) of aluminum nitride (AlN) and/or aluminum oxynitride (AlON) (in case of oxygen containing surface (e.g., sapphire surface)) on the surface of aluminum containing substrate. In one embodiment, exposing the one or more substrates having an aluminum containing surface to the pretreatment gas mixture includes flowing ammonia gas at a flow rate between about 500 sccm to about 12000 sccm, flowing HCl gas at a flow rate between about 200 sccm to about 2200 sccm, and flowing the aluminum halide gas (e.g., AlCl3, AlCl) at a flow rate between about 3 sccm to about 150 sccm. The aluminum halide gas allows independent control of etching and deposition during the pretreatment. In one embodiment, the pretreatment may be performed for about 0.5 minute to about 20 minutes.

At block 240, a group III-nitride layer is formed over a treated surface of the aluminum containing substrates. The group III-nitride layer may be formed by a HVPE process, a MOCVD process, a CVD process, or a PVD process. In one embodiment, the group III-nitride layer may be deposited by providing flows of a group III-metal and nitrogen containing precursors to a processing chamber and using thermal processes to achieve deposition. In one example, the group III-metal precursor may be a metal halide precursor gas, which is discussed below. In one embodiment, the group III-nitride layer is formed in the same chamber where pretreatment is performed. In another embodiment, the group III-nitride layer may be formed in a separate process chamber from the process chamber where nitridation process and pretreatment are performed.

In one embodiment, a GaN layer may be formed during the process of block 240 by a HVPE process. In one embodiment, the HVPE process includes flowing a gallium containing precursor and a nitrogen containing precursor over the one or more substrates at a temperature between about 550 degrees C. to about 1100 degrees C. In one embodiment, the HVPE process includes flowing a gallium chloride containing precursor and a nitrogen containing precursor over the one or more substrates at a temperature between about 950 degrees C. to about 1100 degrees C. In one embodiment, the gallium containing precursor may be generated by flowing chlorine (Cl2) gas at a flow rate between about 20 sccm to about 250 sccm over liquid gallium maintained at a temperature between 500 degrees C. to about 1000 degrees C. In one embodiment, the gallium containing precursor may be generated by flowing hydrogen chloride (HCl) gas at a flow rate between about 40 sccm to about 500 sccm over liquid gallium maintained at a temperature between 500 degrees C. to about 1000 degrees C. The GaN has a growth rate between about 0.3 micron/hour to about 150 micron/hour. In one embodiment, an AlN layer may be formed during the process of block 240 by a HVPE process. In one embodiment, the HVPE process includes flowing an aluminum containing precursor and a nitrogen containing precursor over the one or more substrates at a temperature between about 550 degrees C. to about 1300 degrees C. During the deposition processes, the chamber pressure may be maintained between about 10 Torr and about 760 Torr, such as between about 70 Torr and about 550 Torr, for example about 450 Torr, and the chamber wall temperature is maintained at or above about 400 degrees C. The nitrogen source may be ammonia at a flow rate between about 1 SLM to about 20 SLM. In another embodiment, the nitrogen source may be one or more active nitrogen species derived from remote plasma of a nitrogen-containing material such as nitrogen gas (N2), nitrous oxide (N2O), ammonia (NH3), hydrazine (N2H4), diimide (N2H2), hydrazoic acid (HN3), and the like. While the term hydride vapor phase epitaxy (HVPE) is used to describe a type of deposition process described herein, typically the processes described herein use a metal chloride gas (e.g., GaCl, GaCl3, AlCl, AlCl3, InCl3) in place of a hydride containing gas (e.g., NH3) during the deposition process, and thus this term is not intended to be limiting as to the scope of embodiments of the invention described herein.

Figure 8:
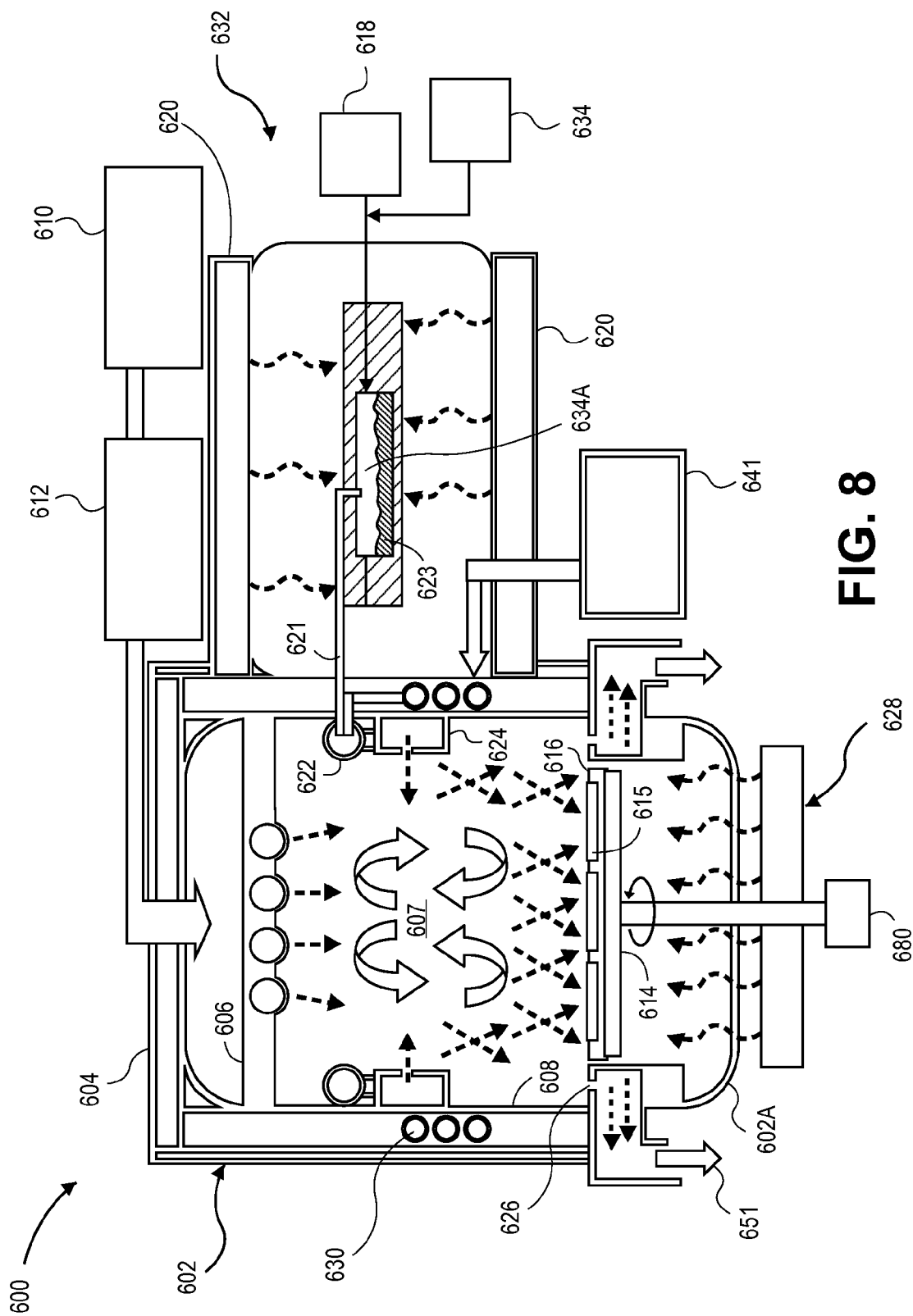
FIG. 8 is a schematic sectional view of an HVPE chamber in accordance with one embodiment of the present disclosure.

FIG. 8 is a schematic sectional view of an HVPE apparatus 600 in accordance with one embodiment which can be used to deposit a group III-nitride layers (e.g., GaN, AlN, AlGaN, AlON) formed using the processes described herein. The HVPE apparatus 600 includes a chamber 602 enclosed by a lid 604. The chamber 602 and the lid 604 define a processing region (deposition zone) 607. A showerhead 606 is disposed in an upper region of the processing region 607. A susceptor 614 is disposed opposing the showerhead 606 in the processing region 607. The susceptor 614 is configured to support a plurality of substrates 615 thereon during processing. In one embodiment, the substrates 615 are disposed on a substrate carrier 616 which is supported by the susceptor 614. The susceptor 614 may be rotated by a motor 680, and may be formed from a variety of materials, including SiC or SiC-coated graphite.

In one embodiment, the HVPE apparatus 600 includes a heating assembly 628 configured to heat the substrates 615 on the susceptor 614. In one embodiment, chamber bottom 602a is formed from quartz and the heating assembly 628 is a lamp assembly disposed under the chamber bottom 602a to heat the substrates 615 through the quartz chamber bottom 602a. In one embodiment, the heating assembly 628 includes an array of lamps that are distributed to provide a uniform temperature distribution across the substrates, substrate carrier, and/or susceptor.

The HVPE apparatus 600 further includes precursor supplying pipes 622, 624 disposed inside the side wall 608 of the chamber 602. The pipes 622 and 624 are in fluid communication with the processing region 607 and an inlet tube 621 found in a precursor source module 632. The showerhead 606 is in fluid communication with the processing region 607 and a first gas source 610. The processing region 607 is in fluid communication with an exhaust 651 through an outlet 626.

The HVPE apparatus 600 further includes a heater 630 embedded within the walls 608 of the chamber 602. The heater 630 embedded in the walls 608 may provide additional heat if needed during the deposition process. A thermocouple may be used to measure the temperature inside the processing chamber. Output from the thermocouple may be fed back to a controller 641 that controls the temperature of the walls of the chamber 602 by adjusting the power delivered to the heater 630 (e.g., resistive heating elements) based upon the reading from a thermocouple (not shown). For example, if the chamber is too cool, the heater 630 will be turned on. If the chamber is too hot, the heater 630 will be turned off. Additionally, the amount of heat provided from the heater 630 may be controlled so that the amount of heat provided from the heater 630 is minimized.

Processing gas from the first gas source 610 is delivered to the processing region 607 through the gas distribution showerhead 606. In one embodiment, the first gas source 610 may include a nitrogen containing compound. In one embodiment, the first gas source 610 is configured to deliver a gas that includes ammonia or nitrogen. In one embodiment, an inert gas such as helium or diatomic nitrogen may be introduced as well either through the gas distribution showerhead 606 or through the pipe 624, disposed on the walls 608 of the chamber 602. In one embodiment, etchant containing gas (e.g. halogen gas, hydrogen halide gas) may be introduced through the pipe 624, disposed on the walls 608 of the chamber 602. An energy source 612 may be disposed between the first gas source 610 and the gas distribution showerhead 606. In one embodiment, the energy source 612 may include a heater or a remote RF plasma source. The energy source 612 may provide energy to the gas delivered from the first gas source 610, so that radicals or ions can be formed, so that the nitrogen in the nitrogen containing gas is more reactive.

The source module 632 includes a halogen or hydrogen halide gas source 618 connected to a well 634A of a source boat and an inert gas source 634 connected to the well 634A. A source material 623, such as aluminum, gallium or indium, is disposed in the well 634A. A heating source 620 surrounds the source boat. An inlet tub 621 connects the well 634A to the processing region 607 via the pipes 622, 624.

In one embodiment, during processing a halogen gas (e.g., Cl2, Br2 or I2) is delivered from the halogen gas source 618 to the well 634A of the source boat to create a metal halide precursor gas. In one embodiment, during processing a hydrogen halide gas (e.g., HCl, HBr or HI) is delivered from the hydrogen halide gas source 618 to the well 634A of the source boat to create a metal halide precursor gas. The interaction of the halogen gas or hydrogen halide gas and the solid or liquid source material 623 allows a metal halide precursor to be formed. In one embodiment, the metal halide gas is a group III-metal halide gas, such as gallium chloride (e.g., GaCl, GaCl3), indium chloride (e.g., InCl3) or aluminum chloride (e.g., AlCl3, AlCl). The source boat may be heated by the heating source 620 to heat the source material 623 and allow the metal halide precursor to be formed. The metal halide precursor is then delivered to the processing region 607 of the HVPE apparatus 600 through an inlet tube 621. In one embodiment, an inert gas (e.g., Ar, He, N2) delivered from the inert gas source 634 is used to carry, or push, the metal halide precursor formed in the well 634A through the inlet tube 621 and pipes 622 and 624 to the processing region 607 of the HVPE apparatus 600. A nitrogen-containing precursor gas (e.g., NH3, N2) may be introduced into the processing region 607 through the showerhead 606, while the metal halide precursor is also provided to the processing region 607, so that a metal nitride layer can be formed on the surface of the substrates 615 disposed in the processing region 607.

Figure 3:
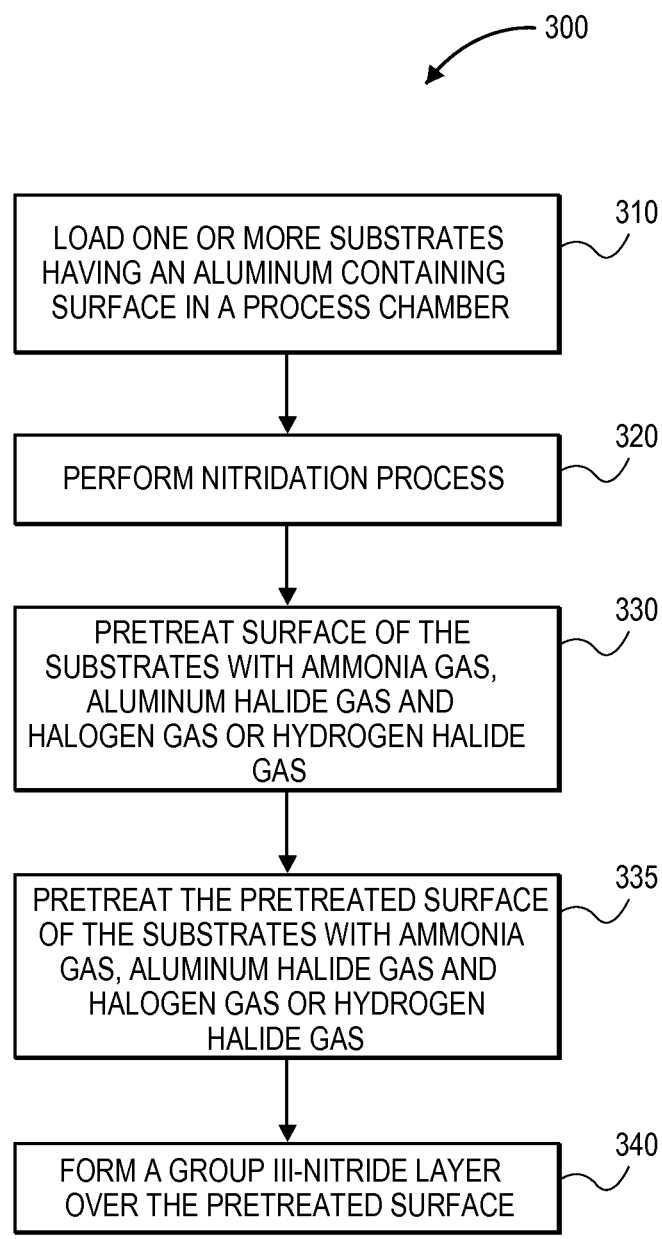
FIG. 3 is a flow diagram of a method according to one embodiment of the present disclosure.

FIG. 3 is a flow diagram of a method 300 according to one embodiment of the present disclosure. The method 300 is similar to the method 200 except that pretreated surfaces of the substrates are exposed to a second pretreatment gas mixture.

At block 310, one or more substrates having an aluminum containing surface are loaded in a processing chamber. In one example, the processing chamber is similar to the HVPE apparatus 600, described above. In one embodiment, the substrates having an aluminum containing surface are sapphire substrates.

At block 320, similar to the process performed at block 220 of method 200, a nitridation process may be performed to the one or more substrates having an aluminum containing surface.

At block 330, a surface of the one or more substrates are exposed to a first pretreatment gas mixture when the surface is at the pretreatment temperature to form a first pretreated surface. The first pretreatment gas mixture may include ammonia gas, an aluminum halide gas, and an etchant containing gas such as a halogen-containing gas, which may be a hydrogen halide gas, or may be hydrogen-free. The halogen-containing gas may be selected from the group consisting of fluorine gas (F2), chlorine gas (Cl2), bromine gas (Br2), iodine gas (I2), hydrogen fluoride (HF), hydrogen chloride gas (HCl), hydrogen bromide gas (HBr), hydrogen iodide gas (HI), combinations thereof, and mixtures thereof.

In one embodiment, exposing the one or more substrates having an aluminum containing surface to the pretreatment gas mixture includes flowing ammonia gas at a flow rate between about 500 sccm to about 12000 sccm, flowing Cl2 gas at a flow rate between about 100 sccm to about 1200 sccm, and flowing the aluminum halide gas (e.g., AlCl3, AlCl, AlBr3, AlBr) at a flow rate between about 3 sccm to about 150 sccm. The aluminum halide gas allows independent control of etching and deposition during the pretreatment. The pretreatment may be performed for about 0.5 minute to about 30 minutes.

At block 335, after the first pretreatment, the first pretreated surface of the one or more substrates are exposed to a second pretreatment gas mixture when the surface is at the pretreatment temperature to form a second pretreated surface. The second pretreatment gas mixture may include ammonia gas, an etchant containing gas such as a halogen-containing gas, and an aluminum halide gas. The etchant containing gas includes a halogen gas or hydrogen halide gas. In some embodiments, the etchant containing gas may be selected from the group consisting of chlorine gas (Cl2), bromine gas (Br2), iodine gas (I2), hydrogen chloride gas (HCl), hydrogen bromide gas (HBr), hydrogen iodide gas (HI), combinations thereof, and mixtures thereof. The second pretreatment gas mixture may be the same or different than the first pretreatment gas mixture. The process parameters (e.g. temperature, chamber pressure, concentrations of active reagents) for second pretreatment may be the same or different than the process parameters for the first pretreatment. A nitridation process may optionally be performed over the one or more substrates having an aluminum containing surface. During nitridation, the one or more substrates having an aluminum containing surface may be heated to a temperature between about 850 degrees C. to about 1100 degrees C. while flowing a nitridation gas mixture to the process chamber for about 5 minutes to about 15 minutes.

At block 340, a group III-nitride layer is formed over the second treated surface of the aluminum containing substrate, similar to the group III-nitride layer forming process of block 240 of method 200.

Figure 4:
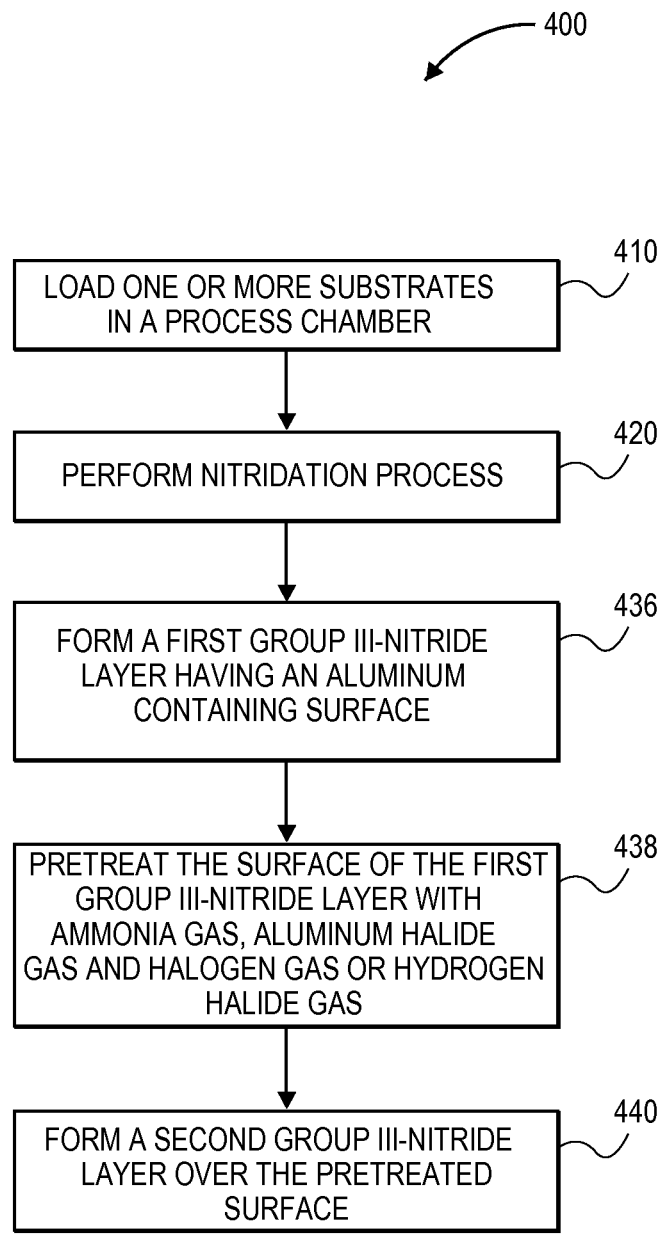
FIG. 4 is a flow diagram of a method according to one embodiment of the present disclosure.

FIG. 4 is a process flow diagram illustrating a method 400 according to one embodiment of the present disclosure. The method 400 discloses treatments to one or more substrates prior to forming a high quality group III-nitride layer (e.g., GaN) for a LED, LD, or power structure. The method 400 includes a nitridation process, forming a first group III-nitride layer on the one or more substrates, pretreating the surface of first group III-nitride layer, and forming a second group III-nitride layer over the pretreated surface of first group III-nitride layer.

At block 410, one or more substrates (e.g., Al2O3, Si, SiC) are loaded in a processing chamber. In one example, the processing chamber is similar to the HVPE apparatus 600 described above.

At block 420, the one or more substrates are nitrided using processes similar to the nitridation process described at block 220 of method 200.

At block 436, a first group III-nitride layer having an aluminum containing surface is then formed on the one or more substrates. The first group III-nitride layer may include aluminum nitride (AlN), or aluminum oxynitride (AlON), or aluminum gallium nitride (AlGaN). In one embodiment, the first group III-nitride layer is a group III-nitride buffer layer (e.g., initial layer, nucleation layer).

In one embodiment, the first group III-nitride layer includes AlN formed by HVPE using ammonia as a nitrogen source, and an aluminum halide gas generated by flowing a halogen contained gas over an aluminum metal source. For example, the first group III-nitride layer may be formed using the HVPE apparatus 600 shown in FIG. 8. The first group III-nitride layer may be formed by generating a metal halide precursor, such as an aluminum chloride precursor, and flowing the metal halide precursor and ammonia gas to the processing region 607 in the process chamber 602 while maintaining the one or more substrates at a temperature between about 550 degrees C. to about 1050 degrees C. In one embodiment, the aluminum chloride precursor is generated by flowing chlorine gas (Cl2) over solid aluminum at a flow rate between about 20 sccm to about 150 sccm with the solid aluminum maintained at a temperature between about 350 degrees C. to about 650 degrees C. In one embodiment, the aluminum chloride precursor is generated by flowing hydrogen chloride gas (HCl) over solid aluminum at a flow rate between about 40 sccm to about 300 sccm with the solid aluminum maintained at a temperature between about 350 degrees C. to about 650 degrees C. In one embodiment, the aluminum source material is maintained between about 450 degrees C. to about 650 degrees C. The first group III-nitride layer may be formed by generating a metal halide precursor, such as an aluminum chloride precursor, and flowing the metal halide precursor, a nitrogen containing precursor gas, and HCl (or Cl2) to the processing region 607 in the process chamber 602 while maintaining the one or more substrates at a temperature between about 550 degrees C. to about 1050 degrees C.

In one embodiment, the nitrogen source may be ammonia. In another embodiment, the nitrogen source may be one or more active nitrogen species derived from a remote plasma of a nitrogen-containing material such as nitrogen gas (N2), nitrous oxide (N2O), ammonia (NH3), hydrazine (N2H4), diimide (N2H2), hydrazoic acid (HN3), and the like. In one embodiment, the flow rate of nitrogen source may be between about 1000 sccm to about 22000 sccm.

At block 438, similar to the pretreatment performed at block 330 of method 300, the surface of first group III-nitride layer on the one or more substrates are exposed to a pretreatment gas mixture when the surface is at the pretreatment temperature to form a pretreated surface. The pretreatment gas mixture may include ammonia gas, an etchant containing gas, and an aluminum halide gas. The etchant containing gas includes a halogen gas or hydrogen halide gas.

In some embodiments, the pretreatment gas mixture may include ammonia gas, an aluminum halide gas, and a halogen-containing gas, which may be a hydrogen halide gas, or may be hydrogen-free. The halogen-containing gas may be selected from the group consisting of fluorine gas (F2), chlorine gas (Cl2), bromine gas (Br2), iodine gas (I2), hydrogen fluoride (HF), hydrogen chloride gas (HCl), hydrogen bromide gas (HBr), hydrogen iodide gas (HI), combinations thereof, and mixtures thereof.

In one embodiment, the pretreatment process may be performed at a temperature range between about 500 degrees C. to about 1200 degrees C.

At block 440, a second group III-nitride layer is formed over pretreated surface of the first group III-nitride layer, similar to the group III-nitride layer forming process of block 240 of method 200. In one embodiment, the second group III-nitride layer may be formed by flowing a gallium chloride precursor and a nitrogen source to the process chamber while heating the one or more substrates to a temperature between about 550 degrees C. to about 1100 degrees C. In one embodiment, the second group III-nitride layer may be formed by flowing a gallium chloride precursor and a nitrogen source to the process chamber while heating the one or more substrates to a temperature between about 950 and about 1100 degrees C. In one example, the temperature is maintained at about 1050 degrees C. In one embodiment, the gallium chloride precursor is generated by flowing chlorine gas over gallium at a flow rate between about 5 sccm to about 300 sccm with gallium maintained at a temperature between about 550 degrees C. to about 1000 degrees C. In one embodiment, the gallium chloride precursor is generated by flowing hydrogen chloride gas over gallium at a flow rate between about 5 sccm to about 300 sccm with gallium maintained at a temperature between about 550 degrees C. to about 1000 degrees C.

Figure 5:
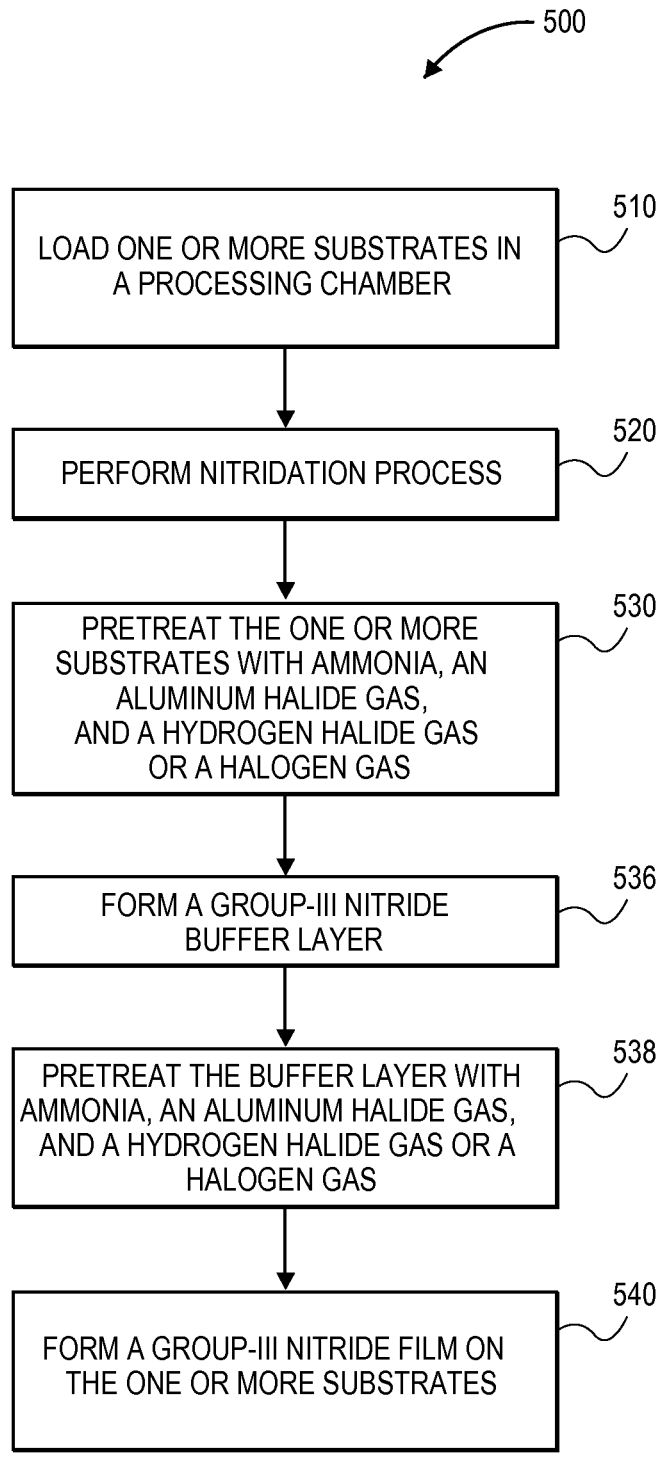
FIG. 5 is a flow diagram of a method according to one embodiment of the present disclosure.

FIG. 5 is a process flow diagram illustrating a method 500 according to one embodiment of the present disclosure. The method 500 discloses treatments to one or more substrates having an aluminum containing surface prior to forming a group III nitride film (e.g, GaN, AlGaN). The method 500 includes nitridation process, pretreating, forming a buffer layer on the one or more substrates, and another pretreating prior to forming a group-III nitride film.

At block 510, the one or more substrates are positioned in a processing chamber. In one example, the processing chamber is similar to the HVPE apparatus 600 described above.

At block 520, the one or more substrates are nitrided using processes similar to the nitridation process described at block 220 of method 200.

At block 530, the one or more substrates are exposed to a pretreatment gas mixture at an elevated temperature for a pretreatment to enable high quality group III nitride film to be formed over the substrates. The pretreatment gas mixture may include ammonia, an aluminum halide precursor (e.g., AlCl3, AlCl), and a halogen gas or a hydrogen halide gas.

At block 536, a buffer layer is then formed on the pretreated substrates. The buffer layer may include aluminum nitride (AlN) and/or aluminum oxynitride (AlON), or gallium nitride. In one embodiment, the buffer layer is formed by one of the processes described above with block 436 of the method 400.

In one embodiment, at block 538, the buffer layer of the one or more substrates are exposed to an optional pretreatment gas mixture at an elevated temperature for a pretreatment to enable high quality group III nitride film to be formed over the substrates. In one embodiment, the pretreatment process may be performed at a temperature range between about 500 degrees C. to about 1200 degrees C.

The pretreatment gas mixture may include ammonia, a metal halide precursor (e.g., an aluminum halide precursor), and a halogen gas or a hydrogen halide gas. The pretreatment gas mixture may include ammonia, a metal halide precursor (e.g., an aluminum halide precursor), and HCl.

At block 540, a group-III nitride film is formed over the treated surface of the buffer layer of the substrates, similar to the group-III nitride film forming process of block 240 of method 200.

Figure 6:
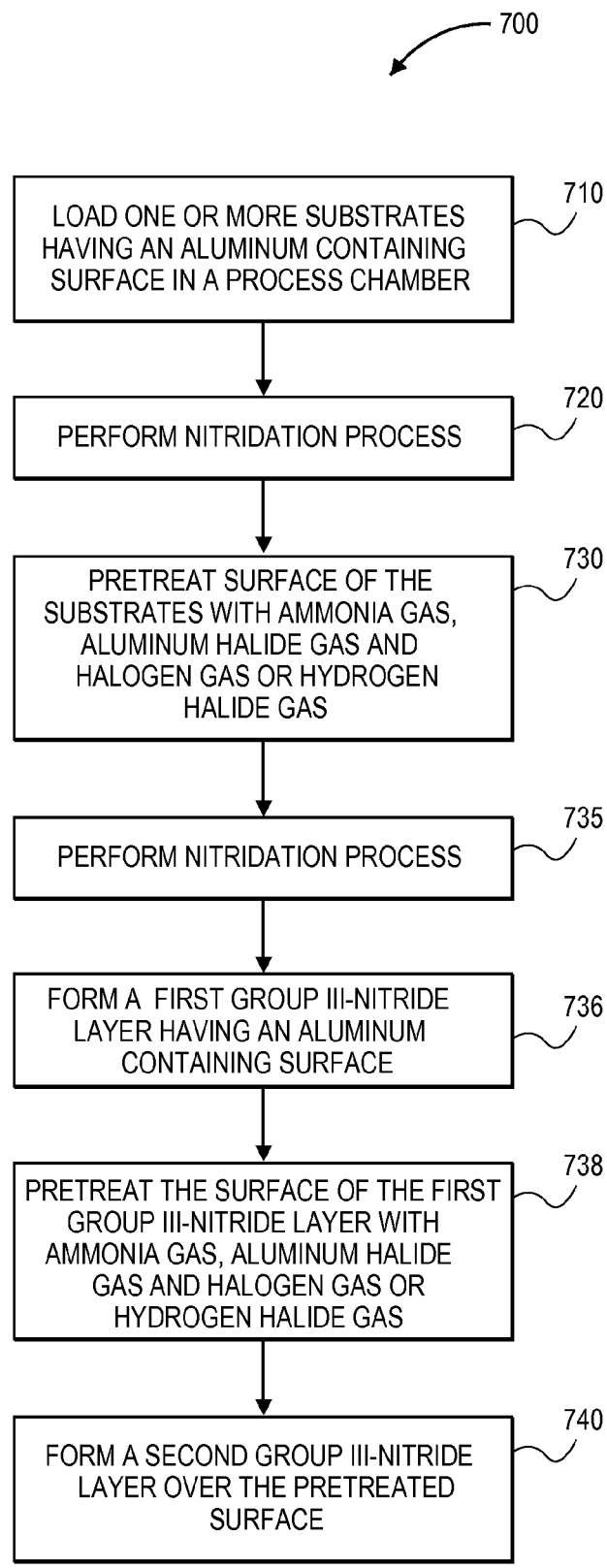
FIG. 6 is a flow diagram of a method according to one embodiment of the present disclosure.

FIG. 6 is a process flow diagram illustrating a method 700 according to one embodiment of the present disclosure. The method 700 discloses treatments to one or more substrates having an aluminum containing surface prior to forming a group III-nitride layer (e.g., GaN, AlGaN, AlN). The method 700 includes nitridation process, pretreating, forming a first group III-nitride layer on the one or more substrates having an aluminum containing surface, and another pretreating prior to forming a second group III-nitride layer.

At block 710, the one or more substrates having an aluminum containing surface are positioned in a processing chamber. In one example, the processing chamber is similar to the HVPE apparatus 600 described above.

At block 720, the one or more substrates having an aluminum containing surface are nitrided using processes similar to the nitridation process described at block 220 of method 200.

At block 730, similar to the pretreatment performed at block 330 of method 300, a surface of the one or more substrates are exposed to a first pretreatment gas mixture when the surface is at the pretreatment temperature to form a first pretreated surface.

At block 735, an optional nitridation process is then performed on first pretreated surface by exposing the surface to a nitridation gas mixture. The nitridation process may be similar to the nitridation process described at block 220 of method 200.

At block 736, a first group III-nitride layer is then formed on first pretreated surface. The layer may be formed in a similar way as described at block 436 of method 400.

At block 738, similar to the pretreatment performed at block 438 of method 400, the surface of first group III-nitride layer is exposed to a pretreatment gas mixture when the surface is at the pretreatment temperature to form a pretreated surface. In one embodiment, the pretreatment process may be performed at a temperature range between about 500 degrees C. to about 1200 degrees C. The aluminum halide gas allows independent control of etching and deposition during the pretreatment.

At block 740, a second group III-nitride layer is formed over the pretreated surface of the first group III-nitride layer.

As discussed above, the methods described according to embodiments of the present disclosure may be performed in a single chamber, or performed in two or more changes in a cluster tool.

In one embodiment, when processes of a method are performed in a single chamber, ammonia and/or inert gas (e.g., N2, Ar, He) may be flown to the process chamber constantly during the process steps like temperature ramp-up, temperature ramp-down, nitridation process. Ammonia is flow to the process chamber at a flow rate between about 3000 sccm to about 9000 sccm during temperature ramp-up and temperature ramp down.

It should be noted that active gases described above in association with embodiments of the present disclosure, such as group III-metal precursors, metal halide gases, halogen gases, ammonia gas, chlorine gas, HCl gas, may be diluted by an inert gas during processing. Suitable inert gas may be argon (Ar), helium (He), nitrogen (N2), or combinations thereof. The pressure in the processing chamber during the above cleaning, pretreating, nitridation and deposition may be between about 10 Torr to about 760 Torr.

Figure 7:
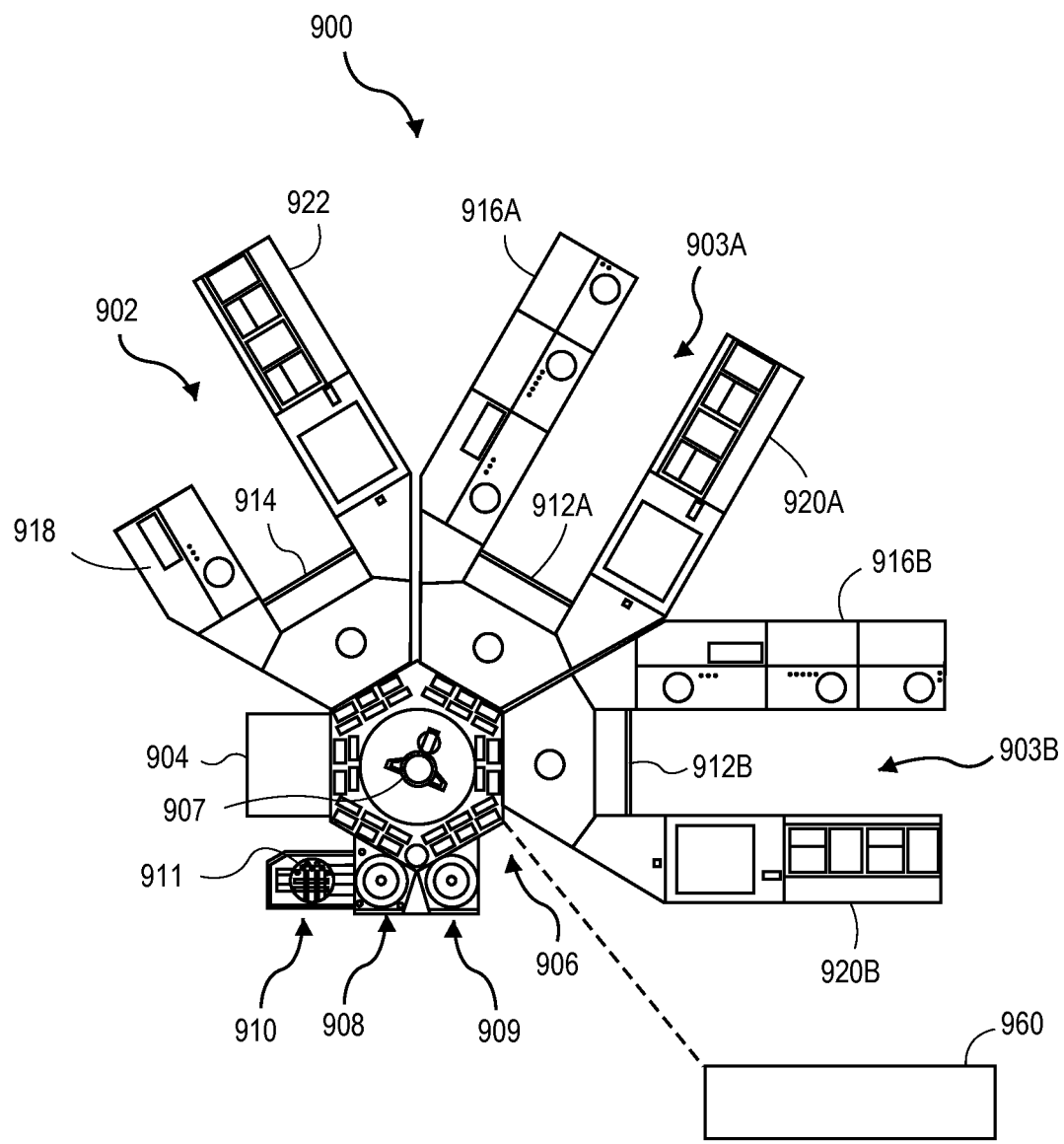
FIG. 7 is a cluster tool according to one embodiment of the present disclosure.

In another embodiment, one or more substrates may be treated in a chamber first, then move to a different chamber within a tool for subsequent processing. FIG. 7 is a cluster tool 900 that may be used in a process according to one embodiment of the present disclosure. The cluster tool 900 is configured to form nitride compound structures.

In one embodiment, the cluster tool 900 includes one HVPE chamber 902 and multiple MOCVD chambers 903a and 903b connected to a transfer chamber 906 for fabricating compound nitride semiconductor devices according to embodiments described herein. Although one HVPE chamber 902 and two MOCVD chambers 903a and 903b are shown, it should be understood that any combination of one or more MOCVD chambers with one or more HVPE chambers may also be coupled with the transfer chamber 906. For example, in one embodiment, the cluster tool 900 may include 3 MOCVD chambers. In another embodiment, the processes described herein may be performed in a single MOCVD chamber. It should also be understood that although a cluster tool is shown, the embodiments described herein may also be performed using a linear processing system.

In one embodiment, an additional chamber 904 is coupled with the transfer chamber 906. The additional chamber 904 may be an MOCVD chamber, an HVPE chamber, a metrology chamber, a degassing chamber, an orientation chamber, a cool down chamber, a pretreatment/preclean chamber, a post-anneal chamber, or the like. In one embodiment, the transfer chamber 906 is six-sided and hexagonal in shape with six positions for process chamber mounting. In another embodiment, the transfer chamber 906 may have other shapes and have five, seven, eight, or more sides with a corresponding number of process chamber mounting positions.

The HVPE chamber 902 is adapted to perform HVPE processes in which gaseous metal halides are used to epitaxially grow thick layers of compound nitride semiconductor materials on heated substrates. The HVPE chamber 902 includes a chamber body 914 where a substrate is placed to undergo processing, a chemical delivery module 918 from which gas precursors are delivered to the chamber body 914, and an electrical module 922 that includes the electrical system for the HVPE chamber of the cluster tool 900. In one embodiment, the HVPE chamber 902 may be similar to the HVPE apparatus 600 described in FIG. 8.

Each MOCVD chamber 903a, 903b includes a chamber body 912a, 912b forming a processing region where a substrate is placed to undergo processing, a chemical delivery module 916a, 916b from which gases such as precursors, purge gases, and cleaning gases are delivered to the chamber body 912a, 912b and an electrical module 920a, 920b for each MOCVD chamber 903a, 903b that includes the electrical system for each MOCVD chamber of the cluster tool 900. Each MOCVD chamber 903a, 903b is adapted to perform CVD processes in which metalorganic precursors (e.g., TMG, TMA) react with metal hydride elements to form thin layers of compound nitride semiconductor materials.

The cluster tool 900 further includes a robot assembly 907 housed in the transfer chamber 906, a load lock chamber 908 coupled with the transfer chamber 906, a batch load lock chamber 909, for storing substrates, coupled with the transfer chamber 906. The cluster tool 900 further includes a load station 910, for loading substrates, coupled with the load lock chamber 908. The robot assembly 907 is operable to pick up and transfer substrates between the load lock chamber 908, the batch load lock chamber 909, the HVPE chamber 902, and the MOCVD chambers 903a, 903b. In one embodiment, the load station 910 is an automatic loading station configured to load substrates from cassettes to substrate carriers or to the load lock chamber 908 directly, and to unload the substrates from substrate carriers or from the load lock chamber 908 to cassettes.

The transfer chamber 906 may remain under vacuum and/or at a pressure below atmosphere during the process. The vacuum level of the transfer chamber 906 may be adjusted to match the vacuum level of corresponding processing chambers. In one embodiment, the transfer chamber 906 maintains an environment having greater than 90% N2 for substrate transfer. In another embodiment, the transfer chamber 906 maintains an environment of high purity NH3 for substrate transfer. In one embodiment, the substrate is transferred in an environment having greater than 90% NH3. In another embodiment, the transfer chamber 906 maintains an environment of high purity H2 for substrate transfer. In one embodiment, the substrate is transferred in an environment having greater than 90% H2.

The cluster tool 900 further includes a system controller 960 which controls activities and operating parameters. The system controller 960 includes a computer processor and a computer-readable memory coupled to the processor. The processor executes system control software, such as a computer program stored in memory.

In one embodiment, one of the processing chamber 902, 903*a*, 903*b*, or 904 is configured to clean and pretreat the substrates according to methods described above prior to forming device structures. The cleaned and treated substrates are then transferred to one or more deposition chambers to deposit the layers used to form the LED or LD structures. In one embodiment, the substrates may be cleaned, pretreated, nitridation, and/or covered with a III-Nitride layers (e.g., AlN buffer layer, undoped GaN layer, n-doped GaN layer) in the HVPE processing chamber 902, then moved to MOCVD processing chambers 903*a* or/and 903*b* for forming group III-nitride layers for the device structure (n-doped GaN layer, AlGaN layer, MQW structure, p-doped AlGaN layer, p-doped GaN layer). In another embodiment, the substrates may be pretreated in the HVPE processing chamber 902, then moved to MOCVD processing chambers 903*a* or/and 903*b* for forming subsequent layers for the device structure.

Figure 9:
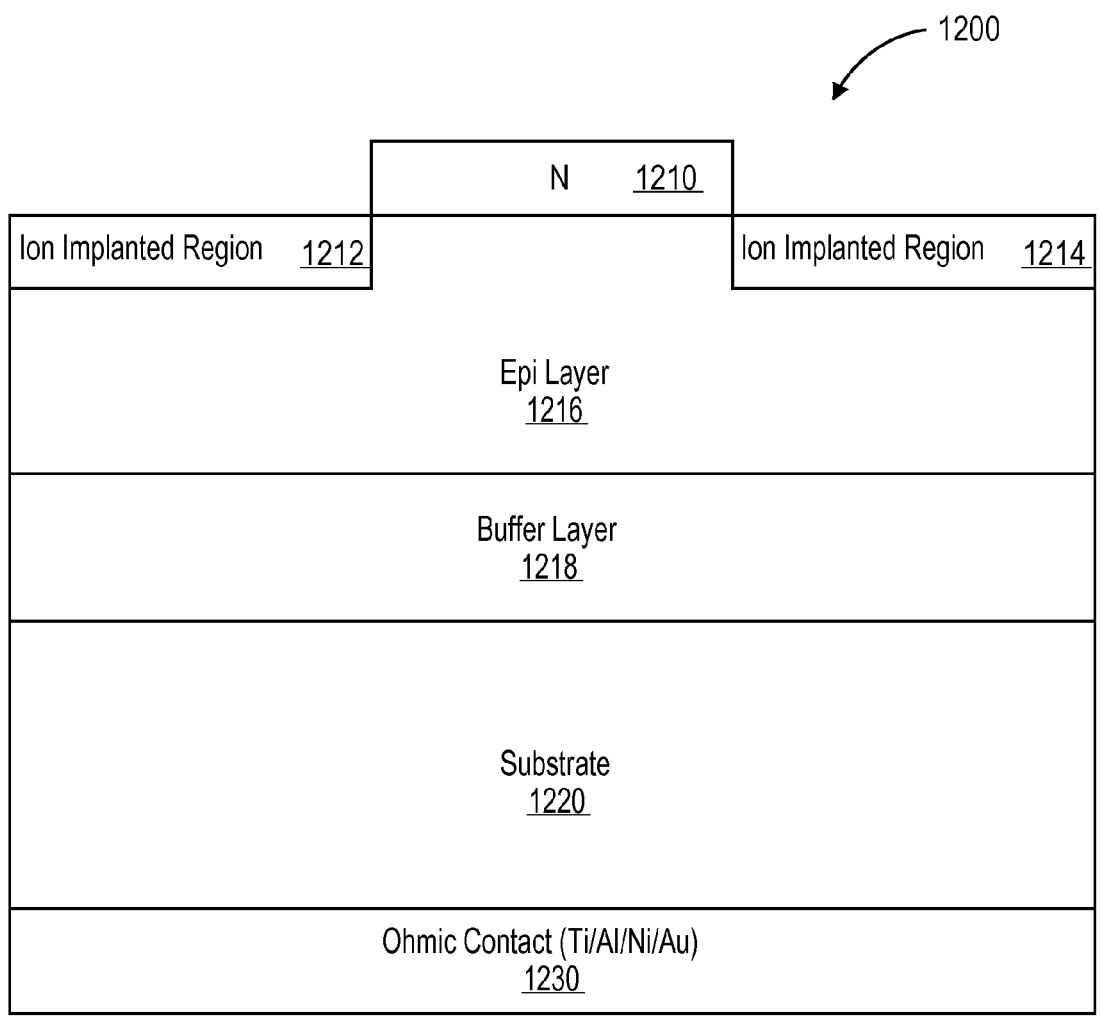
FIG. 9 illustrates a cross-sectional view of a power device in accordance with one embodiment of the present disclosure.

FIG. 9 illustrates a cross-sectional view of a power electronics device in accordance with one embodiment. The power electronic device 1200 may include an N type region 1210 (e.g., electrode), ion implanted regions 1212 and 1214, an epitaxial layer 1216 (e.g., n-type GaN epilayer with a thickness of 4 microns), a buffer layer 1218 that may be pretreated, a substrate 1220 (e.g., substrate having an aluminum containing surface that can be pretreated, bulk GaN substrate, silicon substrate, pretreated substrate), and an ohmic contact 1230 (e.g., Ti/Al/Ni/Au). In one embodiment, a surface of the substrate is pretreated. In another embodiment, a surface of the buffer layer 1218 is pretreated. Any of the pretreatment methods described herein can be implemented to form the power electronic device 1200. The device 1200 may include one or more layers of GaN or group III nitride layers disposed on an AlGaN substrate or a GaN substrate or a silicon substrate or a substrate having an aluminum containing surface. The device (e.g., power IC, power diode, power thyristor, power MOSFET, IGBT, GaN HEMT transistor, etc.) may be used for switches or rectifiers in power electronics circuits and modules.

While the foregoing is directed to embodiments of the present disclosure, other and further embodiments of the invention may be devised without departing from the basic scope thereof, and the scope thereof is determined by the claims that follow.

What is claimed is:

1. A method, comprising:
providing one or more substrates having an aluminum containing surface in a processing chamber; and
exposing a substrate surface of each of the one or more substrates to a first pretreatment gas mixture to form a pretreated surface of each of the one or more substrates by flowing an ammonia gas and a hydrogen halide gas to a processing region of the processing chamber and flowing an aluminum halide gas to the processing region to allow independent control of etching and deposition during the pretreatment.

2. The method of claim 1, further comprising:
forming a group III-nitride layer over the pretreated surface, wherein the group III-nitride layer comprises at least one of a gallium nitride (GaN) layer and an aluminum nitride (AlN) layer.

3. The method of claim 2, further comprising:
exposing a surface of the group III-nitride layer of the one or more substrates to a second pretreatment gas mixture to form a second pretreated surface, wherein the second pretreatment gas mixture comprises ammonia ($NH_3$) gas, an etchant containing gas, and an aluminum halide gas.

4. The method of claim 3, wherein the etchant containing gas is a hydrogen halide gas or a halogen gas.

5. The method of claim 1, wherein the aluminum halide gas added during the pretreatment accelerates the deposition rate of AlN.

6. The method of claim 5, wherein the group III-nitride layer comprises a group III-nitride buffer layer for subsequent group III-nitride deposition, wherein the group III-nitride buffer layer comprises an aluminum nitride (AlN) layer.

7. The method of claim 1, wherein the aluminum halide gas is an aluminum chloride gas, wherein the aluminum chloride gas is formed by exposing an aluminum metal source to a processing gas comprising chlorine ($Cl_2$) gas.

8. The method of claim 7, wherein the aluminum chloride gas is formed by exposing an aluminum metal source to a processing gas comprising hydrogen chloride (HCl) gas.

9. The method of claim 1, wherein the hydrogen halide gas comprises a hydrogen chloride (HCl) gas, wherein the substrates having an aluminum containing surface are sapphire substrates.

10. A method, comprising:
providing one or more substrates having an aluminum containing surface in a processing chamber; and
exposing a substrate surface of each of the one or more substrates to a first pretreatment gas mixture to form a first pretreated surface of each of the one or more substrates, wherein the first pretreatment gas mixture comprises an ammonia ($NH_3$) gas, a first etchant containing gas, and an aluminum halide gas; and
exposing the first pretreated surface of the one or more substrates to a second pretreatment gas mixture to form a second pretreated surface, wherein the second pretreatment gas mixture comprises the ammonia ($NH_3$) gas, a second etchant containing gas, and the aluminum halide gas.

11. The method of claim 10, further comprising:
forming a group III-nitride layer over the second pretreated surface, wherein the group III-nitride layer comprises at least one of a gallium nitride (GaN) layer and an aluminum nitride (AlN) layer.

12. The method of claim 10, wherein the first and second etchant containing gases comprise a hydrogen halide gas.

13. The method of claim 10, wherein the first and second etchant containing gases comprise a halogen gas.

14. The method of claim 13, wherein the halogen gas comprises a chlorine ($Cl_2$) gas, wherein the aluminum halide gas comprises an aluminum chloride gas.

15. A method, comprising:
providing one or more substrates in a processing chamber;
forming a first group III-nitride layer having an aluminum containing surface over the one or more substrates; and
exposing a surface of the first group III-nitride layer to a pretreatment gas mixture to form a pretreated surface of the first group III-nitride layer, wherein the pretreatment gas mixture comprises ammonia ($NH_3$) gas, an etchant containing gas, and an aluminum halide gas, wherein the etchant containing gas comprises a hydrogen halide gas.

16. The method of claim 15, wherein the etchant containing gas comprises a halogen gas.

17. The method of claim 15, wherein the aluminum halide gas comprises an aluminum chloride gas.

18. The method of claim 15, wherein the first group III-nitride layer comprises at least one of an aluminum nitride (AlN) layer and a group III-nitride buffer layer for subsequent group III-nitride deposition.

19. The method of claim 15, further comprising:
forming a second group III-nitride layer over the pretreated surface of the first group III-nitride layer.

* * * * *